United States Patent
Ramos et al.

(10) Patent No.: US 9,887,674 B2
(45) Date of Patent: Feb. 6, 2018

(54) MULTI-STAGE AMPLIFIER WITH IMPROVED OPERATING EFFICIENCY

(71) Applicant: Dialog Semiconductor (UK) Limited, London (GB)

(72) Inventors: Carlos Zamarreno Ramos, Munich (DE); Ambreesh Bhattad, Swindon (GB); Frank Kronmueller, Neudenau (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/232,422

(22) Filed: Aug. 9, 2016

(65) Prior Publication Data

US 2017/0093350 A1 Mar. 30, 2017

(30) Foreign Application Priority Data

Sep. 28, 2015 (DE) .................. 10 2015 218 648

(51) Int. Cl.
*H03F 1/14* (2006.01)
*H03F 1/34* (2006.01)
(Continued)

(52) U.S. Cl.
CPC ............ *H03F 1/342* (2013.01); *H03F 1/14* (2013.01); *H03F 3/193* (2013.01); *H03F 3/45179* (2013.01); *H03F 3/45475* (2013.01); *H03F 2200/135* (2013.01); *H03F 2200/153* (2013.01); *H03F 2200/297* (2013.01); *H03F 2200/36* (2013.01); *H03F 2200/411* (2013.01); *H03F 2200/462* (2013.01); *H03F 2200/474* (2013.01)

(58) Field of Classification Search
CPC ......... H03F 3/68; H03F 2200/153; H03F 1/14

USPC ................. 330/98, 99, 100, 107, 109, 292
See application file for complete search history.

(56) References Cited

U.S. PATENT DOCUMENTS

| | | | | |
|---|---|---|---|---|
| 6,232,834 B1 * | 5/2001 | Zheng | ............. | G01R 31/2837 330/107 |
| 7,142,059 B2 * | 11/2006 | Klein | ............. | H03F 3/3022 330/282 |
| 7,218,168 B1 * | 5/2007 | Rahman | ............. | G05F 1/56 323/273 |

FOREIGN PATENT DOCUMENTS

| | | |
|---|---|---|
| DE | 103 45 521 | 8/2005 |
| JP | H 07106885 | 4/1995 |

OTHER PUBLICATIONS

German Office Action, File No. 10 2015 218 648.2, Applicant: Dialog Semiconductor (UK) Limited, dated Aug. 8, 2016, 5 pgs and English language translation 5 pgs.

* cited by examiner

*Primary Examiner* — Steven J Mottola
(74) *Attorney, Agent, or Firm* — Saile Ackerman LLC; Stephen B. Ackerman

(57) ABSTRACT

A multi-stage amplifier, comprising a first amplifier stage is presented. The output of the first amplifier stage is coupled to a first terminal of a capacitor having a controllable capacitance. The input of a second amplifier stage is coupled to the output of the first amplifier stage and the first terminal of the capacitor. The output of the second amplifier stage is coupled to a second terminal of the capacitor and an output of the multi-stage amplifier. The input of a current sensing circuit is coupled with the output of the multi-stage amplifier. A control signal generator is coupled between the output of the current sensing circuit and a control terminal of the (Continued)

capacitor. The control signal generator provides a control signal to the capacitor in order to control or vary the capacitance of the capacitor.

28 Claims, 6 Drawing Sheets

(51) Int. Cl.
*H03F 3/193* (2006.01)
*H03F 3/45* (2006.01)

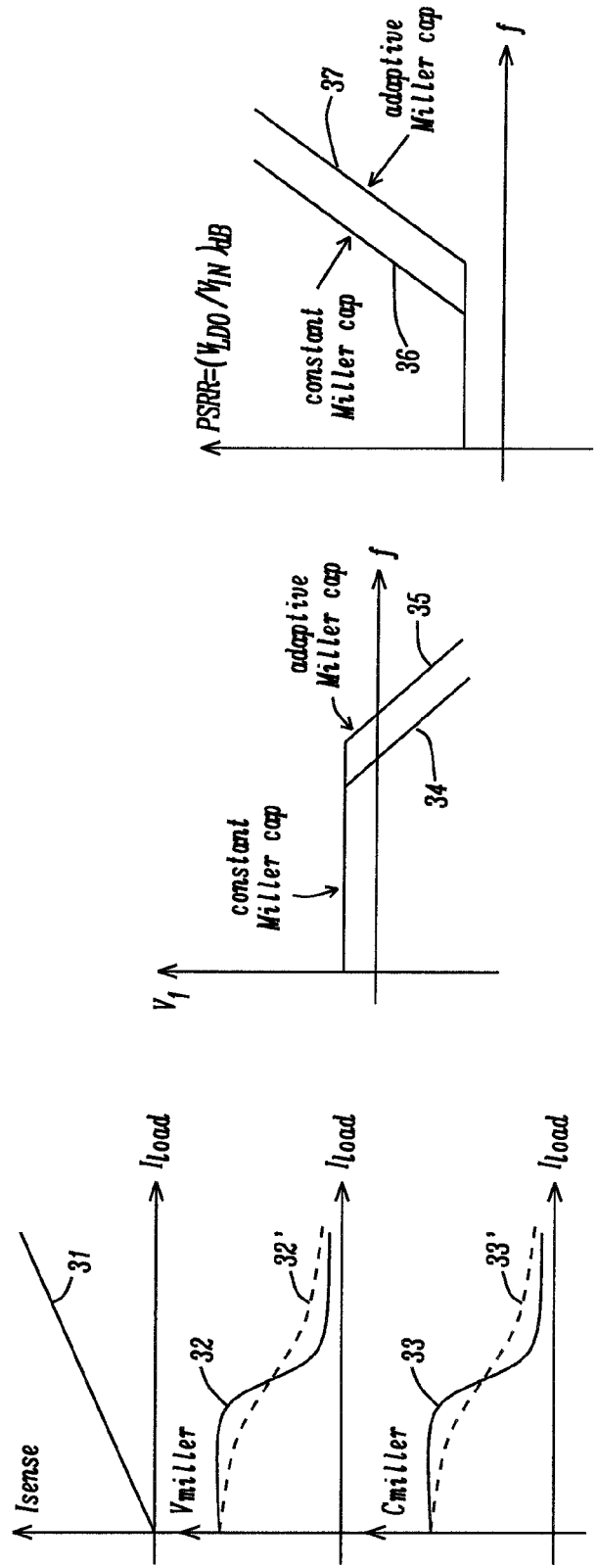

MULTI-STAGE AMPLIFIER WITH IMPROVED OPERATING EFFICIENCY

TECHNICAL FIELD

The present document relates to multi-stage amplifiers and in particular to multi-stage amplifiers using Miller compensation to enhance stability and robustness of the circuits by improving their high-frequency performance.

BACKGROUND

Multi-stage amplifiers have been widely used, for example, for linear regulators or low-dropout (LDO) regulators configured to provide a steady and accurately regulated output voltage. A conventional regulator design requires that the output current load is well defined. However, circuits for LDO regulators need to be stable from no or low load current to a specified maximum load current. This requirement changes significantly the transfer function of LDO circuits and makes it a design challenge to provide a stable supply over a variety of the load conditions for the specified accuracy and power consumption. Furthermore, circuits for a typical linear regulator comprising a multi-stage amplifier structure have multiple internal poles and tend to be unstable when they are used in a closed loop configuration.

A well-known technique to increase stability of multi-stage amplifiers is the Miller compensation. The internal poles, i.e. the dominant and the non-dominant pole, are split due to the presence of a Miller compensation capacitance to achieve good phase margin with minimal overhead, thereby making the regulator operate stably.

FIG. 1 illustrates a typical supply feedback linear regulator using a Miller compensated multi-stage amplifier. The linear regulator 100 comprises a first amplifier stage 101, which may be a differential amplifier stage or differential amplifier (also referred to as error amplifier) at the input, and a second amplifier stage 102 at the output, which can be a single amplifier stage or a cascade of multiple of them and/or buffers. The feedback input 107 of the first amplifier stage 101 receives a fraction of the output voltage $V_{out}$ determined by the feedback factor 106 normally by applying a resistor divider (not shown). The reference input 108 of the first amplifier stage 101 receives a stable voltage reference $V_{ref}$ and the drive voltage to the second amplifier stage 102 changes by a feedback mechanism, i.e. main feedback loop, in case that the output voltage $V_{out}$ changes relative to the reference voltage $V_{ref}$ so that a constant output voltage $V_{out}$ can be maintained.

At the output, the linear regulator 100 may comprise an output capacitance $C_o$ (also referred to as output capacitor or stabilization capacitor or bypass capacitor) 104 parallel to the load 105. The output capacitor 104 is used to stabilize the output voltage $V_{out}$ subject to a change of the load 105, in particular subject to a transient of the load current $I_{load}$. The linear regulator 100 using such a multi-stage amplifier is loaded with a certain current which changes the bandwidth of a last amplifying or buffer stage (e.g. a pass device, not shown) across different operating conditions.

In addition, the linear regulator 100 comprises a Miller capacitor 103 having a capacitance $C_{miller}$ coupled between the output of the first amplifier stage 101 (which is connected to the input of the second amplifier stage 102) and the output of the second amplifier stage 102 (which is also the output of the linear regulator 100). According to the circuit arrangement of the linear regulator 101 shown in FIG. 1, the equivalent capacitance seen by the first amplifier stage 101 is therefore the Miller capacitance, $C_{miller}$, multiplied by the gain of all stages across it, i.e. the second amplifier stage 102 as shown herein. The use of Miller compensation capacitor can thus provide the pole splitting capability needed to get a stable system across different load conditions.

In the prior art, $C_{miller}$ has a constant value, independent of the load conditions, and the constant value is set by stability considerations at low load currents. However, such a large capacitor is not needed at large load currents where the poles are properly split because the output pole goes to higher frequencies. In order to keep a stable operation of the multi-stage amplifier across various load conditions, the bandwidth at the output of the first amplifier stage has to be maximized also at relatively high load currents.

SUMMARY

There is a need to extend the benefit of pole splitting caused by the Miller capacitance to cover a wide range of loads at the output of the linear regulator. In particular, there is a need to provide an adaptively-compensating scheme which maximizes the bandwidth of the first amplifier stage for every load current, while keeping the multi-stage amplifier operate stably. In view of this need, the present document proposes a multi-stage amplifier and a corresponding method having the features of the respective independent claims for maintaining a stable operation of the multi-stage amplifier across various load conditions.

According to a broad aspect of this disclosure, a multi-stage amplifier is provided. The multi-stage amplifier may comprise a plurality of amplifier stages. For example, the multi-stage amplifier may comprise a first amplifier stage such as a differential amplifier stage. The first amplifier stage may have an input and an output. The output of the first amplifier stage may be coupled with a capacitor. The capacitor may act as Miller capacitor to split poles for increasing stability. The capacitor may have a controllable capacitance, that is, the capacitance of the capacitor may be controllable by a control signal. The capacitor may comprise a first terminal, a second terminal and a control terminal. The output of the first amplifier stage may be coupled with the first terminal of the capacitor. In particular, the control terminal of the capacitor may be configured to control the capacitance of the capacitor based on the control signal. The capacitor may comprise, for example, a varactor or a voltage controlled capacitor. The capacitor may then be a configurable Miller capacitor.

The multi-stage amplifier may comprise a second amplifier stage. The second amplifier stage may also have an input and an output. The input of the second amplifier stage may be coupled to the output of the first amplifier stage and the first terminal of the capacitor. The output of the second amplifier stage may be coupled to the second terminal of the capacitor and an output of the multi-stage amplifier. The second amplifier stage may also be referred to as an intermediate amplifier stage and may be a single amplifier stage or a cascade of multiple of amplifier stages. The output of the multi-stage amplifier may be coupled with a load through which a load current flows. In embodiments, a buffer stage or pass device is coupled between the output of the second amplifier stage and the output of the multi-stage amplifier to provide the load current to the load. Alternatively, the buffer stage or pass device may be considered as part of the second amplifier stage. The load current may change the bandwidth of the buffer stage or pass device across different operating conditions. Moreover, the output of the multi-stage amplifier may be coupled with one of the inputs of the first amplifier stage through a feedback factor to provide a main feedback loop.

The multi-stage amplifier may further comprise a current sensing circuit. The current sensing circuit may have an input and an output. The input of the current sensing circuit may be coupled with the output of the multi-stage amplifier. The input of the current sensing circuit may be also coupled with the load at the output of the multi-stage amplifier. The current sensing circuit may be configured to sense the load current through the load. As such, the current sensing circuit may provide a sense current based on the load current through the load. Since the current sensing circuit may be coupled to the load at the output of the multi-stage amplifier, the sense current may depend on the load current. For example, the sense current may be proportional to the load current.

Furthermore, the multi-stage amplifier may comprise a control signal generator. The control signal generator may be coupled between the output of the current sensing circuit and the control terminal of the capacitor. The control signal generator may provide a control signal to the capacitor through the control terminal of the capacitor. The capacitance of the capacitor may be controlled by the control signal. The control signal generator may be, for example, a current-to-voltage converter that provides a control voltage. The control voltage may control the capacitance of the capacitor in a way such that the capacitance of the capacitor may decrease as the control voltage decreases.

The above concept for maintaining a stable operation applies to any kind of multi-stage amplifier loaded with a variable current, for example linear regulators and in particular LDOs.

The current-to-voltage converter may provide the control voltage based on the sense current. For example, the control voltage may decrease as the sense current increases. In this case, the capacitance of the capacitor may also decrease according to the decreasing control voltage. As such, the capacitance of the capacitor may be controlled in a way such that the capacitance of the capacitor depends on the load and may decrease as the load current increases. For example, the capacitance of the capacitor and the load current may have an inverse relation.

In embodiments, the control signal generator may preferably comprise a current mirror. The current mirror may be coupled between the output of the current sensing circuit and the control terminal of the capacitor. The current mirror may receive the sense current from the output of the current sensing circuit. The current mirror may receive the sense current which may be proportional to the load current and generate a corresponding control voltage. In addition, the current mirror may provide the control voltage to the capacitor through the control terminal. The current mirror may optionally comprise an NMOS current mirror. In particular, the NMOS current mirror may be driven by the sense current. Due to the current mirror, the load current of different load conditions can be sensed and the control voltage can be provided accordingly.

According to the disclosure, the control signal generator may further comprise a current source. The current source may be coupled to the current mirror. The current source may provide a constant current. In one embodiment, the control signal generator may provide a control voltage based on the sense current and the constant current from the current source. That is, the sense current may be compared to the constant current to determine the control voltage. For example, a bias current may be larger in a low load current condition and may result in a high control voltage, whereas the control voltage may go down when the load current goes above a limit.

Alternatively, the control signal generator may comprise a diode. The diode may be coupled to the current mirror. In an embodiment, the diode may be configured to convert the sense current to the control voltage. As such, the control signal generator may provide a control voltage by converting the sense current to the control voltage. For example, in presence of the diode, the control voltage may decrease as the sense current or the load current increases. The diode may optionally comprise a diode-coupled PMOS transistor.

The proposed multi-stage amplifier thus allows dynamically changing the capacitance of the Miller capacitor in accordance with the load current of the multi-stage amplifier. It is appreciated that the amount of Miller compensation can be adapted for every load current, thereby maximizing the bandwidth at the output of the first amplifier stage while keeping a stable operation of the multi-stage amplifier. The proposed multi-stage amplifier may be used for linear regulators, providing adaptive Miller compensation and/or variable dominant pole across frequency, thereby improving power supply rejection ratio (PSRR).

According to another aspect, a method of operating a multi-stage amplifier is proposed. The multi-stage amplifier may comprise a first amplifier stage, a second amplifier stage and a Miller capacitor. The multi-stage amplifier may be configured as disclosed above. That is, an output of the first amplifier stage may be coupled to an input of the second amplifier stage. The Miller capacitor may be coupled between the input of the second amplifier stage and an output of the second amplifier stage. In particular, the Miller capacitor may be configurable, i.e. the capacitance of the Miller capacitor may be controllable by a control signal, e.g. a control voltage. The configurable Miller capacitor may be implemented with, for example, a varactor or a voltage controlled capacitor.

According to the disclosure, the method may comprise sensing a load current through a load. The load may be coupled to an output of the multi-stage amplifier. Furthermore, the method may comprise providing a sense current based on the load current. For example, the sense current may be proportional to the load current. The method may further comprise providing a control voltage to the Miller capacitor based on the sense current. The control voltage may be provided in a way such that the control voltage may decrease as the sense current increases. As such, the provided control voltage may decrease as the load current increases.

Furthermore, the method may comprise controlling the capacitance of the Miller capacitor based on the control voltage. Thus, the capacitance of the Miller capacitor may be controlled according to the load current. For example, the capacitance of the Miller capacitor may decrease as the load current increases. In a preferred example, the capacitance of the Miller capacitor may be controlled inversely proportional to the load current.

In order to provide an appropriate control voltage, the method may further comprise converting the sense current to the control voltage, and, in particular, comparing the sense current to a constant current.

As such, by dynamically controlling the capacitance of the Miller capacitor in the multi-stage amplifier according to the load current, the compensation performance of the Miller capacitor can be adapted for various current load conditions. Consequently, the bandwidth at the output of the first amplifier stage can be maximized without losing the stability of the multi-stage amplifier. The proposed method may be used for improving power supply rejection ratio (PSRR) of the multi-stage amplifier.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the terms "couple", "coupled", "connect", and "connected" refer to elements being in electrical communication with each other, whether directly connected e.g., via wires, or in some other manner.

BRIEF DESCRIPTION OF THE DRAWINGS

The application is explained below in an exemplary manner with reference to the accompanying drawings, wherein

FIG. 3(a) shows diagrams of behavior across load current of the different elements of the adaptive Miller compensation according to the embodiment;

FIG. 3(b) shows a transfer function of the output node of the first amplifier stage;

FIG. 3(c) shows the power supply rejection ratio (PSRR) across frequency for using proposed adaptive Miller capacitance and using prior-art fixed Miller capacitance;

DESCRIPTION

Figure 2:
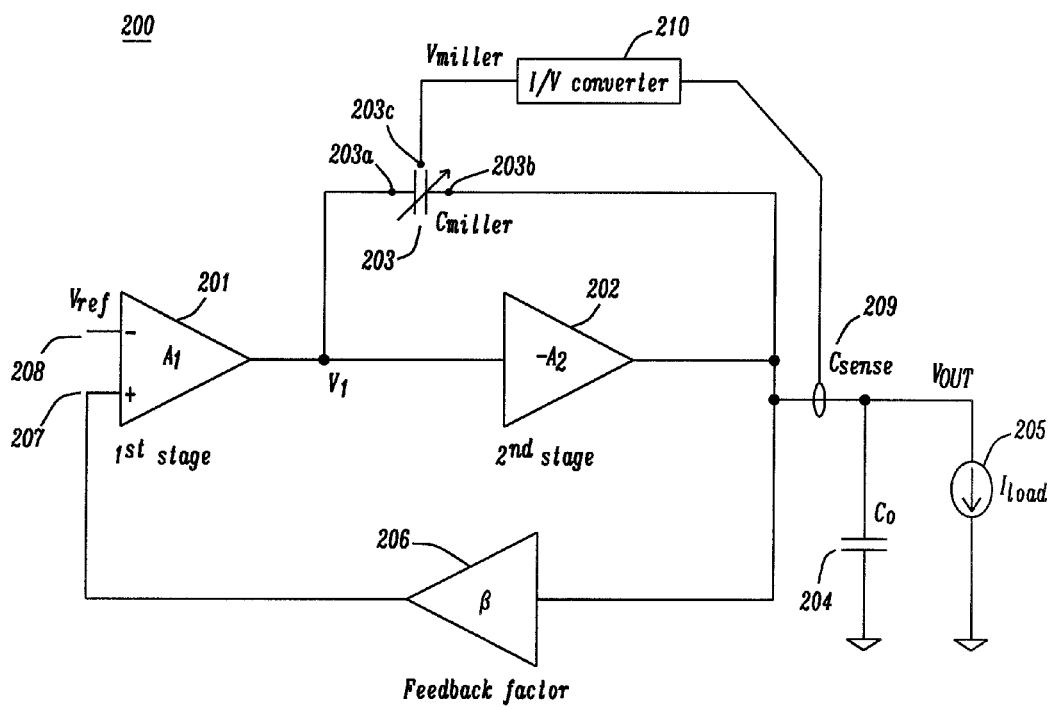
FIG. 2 shows a multi-stage amplifier embodying an example for the adaptive Miller compensation scheme.

FIG. 2 shows a multi-stage amplifier embodying an example for the adaptive Miller compensation scheme. The multi-stage amplifier 200 comprises a first amplifier stage 201, a second amplifier stage 202 and a Miller capacitor 203. The first amplifier stage 201 is a differential amplifier (also referred to as error amplifier) with one input, a reference input 208, coupled to a reference voltage $V_{ref}$ and the other input, a feedback input 207, coupled to the multi-stage amplifier output voltage $V_{out}$, via a feedback factor 206. A load 205 is coupled with the multi-stage amplifier 200 in parallel with an output capacitance $C_o$ 204. The load 205 draws a load current $I_{load}$ from the multi-stage amplifier 200. The second amplifier stage 202 may be an inverter and may comprise a single amplifier stage or a plurality of substages, e.g. a cascade of multiple amplifier stages and/or buffers. The feedback input 207 of the first amplifier stage 201 receives a fraction of the multi-stage amplifier output voltage $V_{out}$ determined by the feedback factor 206. In general, the feedback factor 206 can be determined by applying a resistor divider (not shown). The reference input 208 of the first amplifier stage 201 receives a stable voltage reference $V_{ref}$ and the output voltage of the first amplifier stage $V_1$ changes through a feedback mechanism, i.e. a main feedback loop, in case that the multi-stage amplifier output voltage $V_{out}$ changes relative to the reference voltage $V_{ref}$, thereby maintaining a constant output voltage $V_{out}$ of the multi-stage amplifier 200. One can generally obtain the overall gain of the multi-stage amplifier 200 by multiplying the gain of the first amplifier stage $A_1$ with the gain of the second amplifier stage $A_2$.

The output capacitance $C_o$ 204, also referred to as output capacitor or stabilization capacitor or bypass capacitor, is used to stabilize the multi-stage amplifier output voltage $V_{out}$ subject to a change of the load 205, in particular subject to a transient of the load current $I_{load}$. In an embodiment, a pass device (not shown) is coupled between the output of the second amplifier stage and the output of the multi-stage amplifier to provide the load current to the load. If the multi-stage amplifier 200 is loaded with a varying current, the bandwidth of the pass device changes across different operating conditions.

Figure 1:
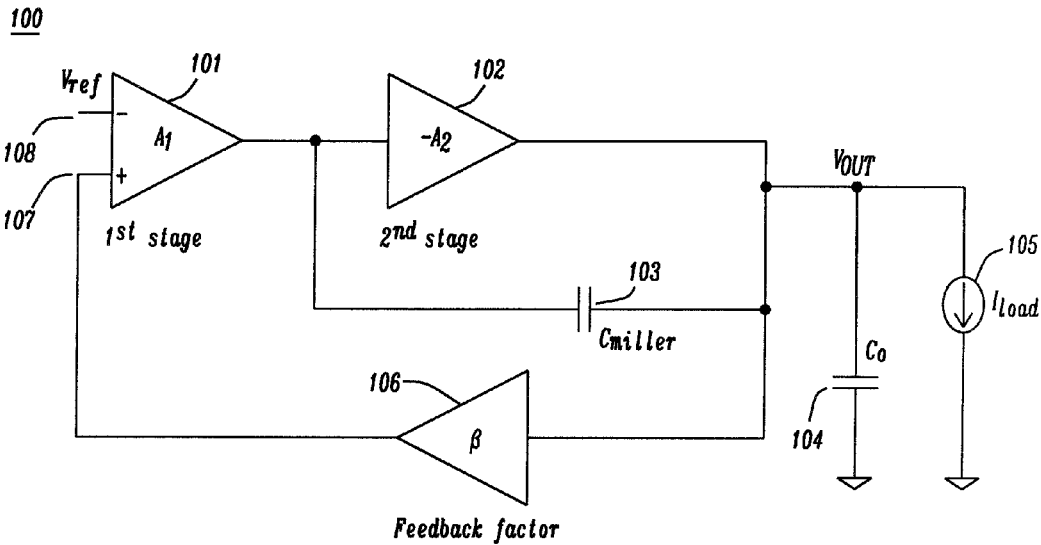
FIG. 1 shows a typical supply feedback linear regulator using a Miller compensated multi-stage amplifier.

Similar to the typical supply feedback linear regulator 100 shown in FIG. 1, the multi-stage amplifier 200 additionally comprises a Miller capacitor 203 having a capacitance $C_{miller}$. The Miller capacitor 203 is coupled between the output of the multi-stage amplifier and the node between the first amplifier stage 201 and the second amplifier stage 202. According to the circuit arrangement of the multi-stage amplifier 200 shown in FIG. 2, the equivalent capacitance seen by the first amplifier stage 201 is therefore the Miller capacitance, $C_{miller}$, multiplied by the gain of the second amplifier stage 202, $A_2$. As a consequence, internal poles are split in the amplifier frequency response and good phase margin can thus be achieved to stabilize the amplifier. According to the embodiment, the present disclosure is described in the context of a linear regulator. It should be noted, however, that the disclosure is applicable to multi-stage amplifiers in general.

According to the disclosure, the Miller capacitor 203 has a controllable capacitance, i.e. the capacitance of the capacitor $C_{miller}$ is controllable by a control signal, e.g. a control voltage. The Miller capacitor 203 comprises a first terminal 203a, a second terminal 203b and a control terminal 203c. The first terminal of the Miller capacitor 203a is coupled to the node $V_1$ between the first amplifier stage 201 and the second amplifier stage 202. The second terminal of the Miller capacitor 203b is coupled to the output of the multi-stage amplifier 200. In particular, the control terminal of the Miller capacitor 203c controls the capacitance of the Miller capacitor 203 $C_{miller}$ with the control signal. In an embodiment, a control voltage $V_{miller}$ can be applied as the control signal to control the capacitance of the Miller capacitor 203 $C_{miller}$. It is noted that the Miller capacitor 203 is configurable rather than having a constant capacitance and can be implemented with, for example but not limited to, a varactor or a voltage controlled capacitor.

In addition, the multi-stage amplifier 200 comprises a current sensing circuit 209. The current sensing circuit 209 is coupled with the output of the multi-stage amplifier 200 to sense the load current $I_{load}$ flowing through the load 205. Subsequently, the current sensing circuit 209 creates and provides a scaled replica of the load current $I_{load}$, i.e. a sense current $I_{sense}$. As a rule, the sense current $I_{sense}$ is dependent on the load current $I_{load}$ and therefore the load current $I_{load}$ can be sensed through the sense current $I_{sense}$ and/or derived from the sense current. In a typical example, the sense current $I_{sense}$ is proportional to the load current $I_{load}$.

According to the disclosure, the multi-stage amplifier 200 further comprises a control signal generator 210. The control signal generator 210 is coupled between the output of the current sensing circuit 209 and the control terminal of the capacitor 203c and provides the Miller capacitor 203 with a control signal to control the capacitance of the Miller capacitor 203. In an embodiment, the control signal generator is a current-to-voltage converter 210 and the current-to-voltage converter 210 provides a control voltage $V_{miller}$ as the control signal to the Miller capacitor 203 through the control terminal of the Miller capacitor 203c. Thus, the capacitance of the Miller capacitor 203 $C_{miller}$ is controlled by the control voltage $V_{miller}$. The control voltage $V_{miller}$ controls the capacitance of the Miller capacitor 203 $C_{miller}$ in a way such that the capacitance of the Miller capacitor 203 $C_{miller}$ decreases as the control voltage $V_{miller}$ decreases. For example, a voltage controlled capacitor or a switchable bank of capacitors can be used for this purpose where the capacitors are selected with the rail to rail voltage $V_{miller}$.

According to the embodiment, the current-to-voltage converter 210 provides the control voltage $V_{miller}$ based on the sense current $I_{sense}$. For example, the control voltage $V_{miller}$ decreases as the sense current $I_{sense}$ increases. As a result, the capacitance of the Miller capacitor 203 $C_{miller}$ also decreases according to the decreasing control voltage $V_{miller}$. Therefore, the capacitance of the Miller capacitor 203 $C_{miller}$ can be controlled in a way such that the capacitance of the Miller capacitor 203 $C_{miller}$ decreases as the load current $I_{load}$ increases. In a preferred example, the capacitance of the Miller capacitor 203 $C_{miller}$ and the load current $I_{load}$ have an inverse relation.

FIG. 3(a) illustrates diagrams of behavior across load current $I_{load}$ of the different elements of the adaptive Miller compensation according to the embodiment: the sensed current provided by the current sensing circuit 209 (the top diagram, curve 31), the output voltage of the current-to-voltage converter 210, i.e. the control voltage $V_{miller}$ (the central diagram, curve 32) and the total equivalent Miller capacitance (the bottom diagram, curve 33) across load conditions. As one can see from the top diagram (curve 31), the sense current $I_{sense}$ increases proportionally to the load current $I_{load}$. In contrast, the control voltage $V_{miller}$ and the total equivalent Miller capacitance $C_{miller}$ decrease as the load current $I_{load}$ increases, as shown in the central and the bottom diagram, curve 32 and curve 33, respectively. In a preferred embodiment, the control voltage $V_{miller}$ and the total equivalent Miller capacitance $C_{miller}$ decrease inversely proportional to the load current $I_{load}$, as indicated by dashed curve 32' and dashed curve 33' of the diagrams, respectively.

When the Miller capacitor 203 is controlled inversely proportional to the load current $I_{load}$, the capacitive loading at the output of the first amplifier stage 201, i.e. a value of $C_{miller}*A_2$, where $A_2$ is the gain of the second amplifier stage, is reduced and the bandwidth of this node ($V_1$) is extended. This can be observed from FIG. 3(b) presenting the transfer function of the output node of the first amplifier stage 201, i.e. the frequency response of node $V_1$, for constant Miller capacitance and for adaptive Miller capacitance. Curve 34 represents the frequency response of node $V_1$ for constant Miller capacitance, while curve 35 represents the frequency response of node $V_1$ for adaptive Miller capacitance. The diagram FIG. 3(b) clearly shows that the transfer function can be shifted towards higher frequency by using adaptive Miller capacitance, indicating that bandwidth extension can be achieved with the adaptive Miller compensation scheme.

FIG. 3(c) shows how the power supply rejection ratio (PSRR) across frequency is modified by using the adaptive Miller capacitance. PSRR herein can be calculated by the ratio of the output voltage of the multi-stage amplifier 200, $V_{LDO}$, to the input voltage of the multi-stage amplifier 200, $V_{in}$. Due to the larger bandwidth at low frequency, PSRR can be significantly improved. Curve 36 represents the PSRR across frequency for constant Miller capacitance, while curve 37 represents the PSRR across frequency for adaptive Miller capacitance. The diagram FIG. 3(c) clearly shows that the PSRR can be shifted towards higher frequency by using adaptive Miller capacitance, indicating that the PSRR can be improved at medium frequencies with the adaptive Miller compensation scheme.

As such, the proposed multi-stage amplifier allows dynamically changing the capacitance of the Miller capacitor in accordance with the load current of the multi-stage amplifier. It is appreciated that the bandwidth at the output of the first amplifier stage can be increased by adapting the amount of Miller compensation for every load current, while a stable operation of the multi-stage amplifier is still maintained. The proposed multi-stage amplifier may be used for linear regulators requiring adaptive Miller compensation and/or variable dominant pole across frequency, thereby improving the PSRR of the linear regulators.

FIG. 4 shows two potential transistor level implementations for a multi-stage amplifier using the adaptive Miller compensation scheme according to embodiments. In the embodiments, the load current $I_{load}$ is sensed. The current-to-voltage converter 210 of FIG. 2 comprises a current mirror 42. The current mirror 42 is coupled between the output of the current sensing circuit 209 and the control terminal of the Miller capacitor 203. The current mirror 42 receives the sense current $I_{sense}$ from the output of the current sensing circuit 209. Although it is not shown, it should be noted that the current sensing scheme provided by the current sensing circuit 209 may depend on the implementation of the output stage of the amplifier.

It is further noted that the sense current $I_{sense}$ received by the current mirror 42 can be proportional to the load current $I_{load}$. In addition, the current mirror 42 provides the control voltage $V_{miller}$ to the Miller capacitor 203 through the control terminal 203c to control the capacitance of the Miller capacitor 203. According to a preferred embodiment, the current mirror 42 is optionally implemented with an NMOS current mirror. In particular, the sense current $I_{sense}$ is driven to the NMOS current mirror. Due to the current mirror 42, the load current of different load conditions can be sensed and the control voltage $V_{miller}$ can be provided accordingly.

Figure 4A:
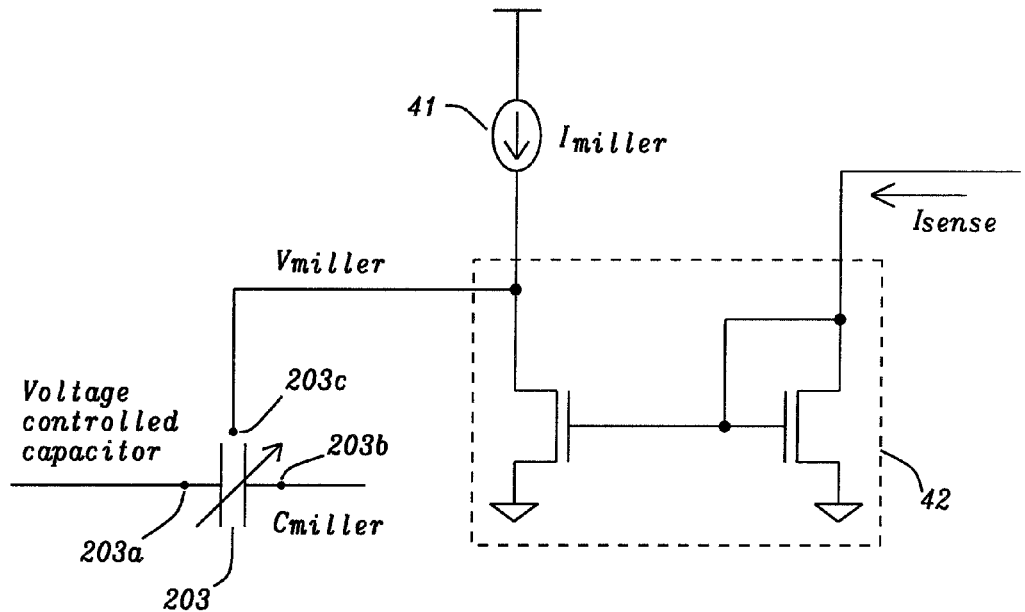
FIG. 4 shows potential transistor level implementations embodying an example for the multi-stage amplifier using the adaptive Miller compensation scheme, using a current source (FIG. 4(a)) or a diode (FIG. 4(b))

As indicated above, the current-to-voltage converter 210 of FIG. 2 may further comprise a current source 41, as shown in FIG. 4(a). The current source 41 is coupled to the current mirror 42. According to the embodiment, the current source 41 provides a constant current and the current-to-voltage converter 210 provides the control voltage $V_{miller}$ based on the sense current $I_{sense}$ and the constant current obtained from the current source 41. That is, a current proportional to the sense current $I_{sense}$ (as given by the current mirror ratio) is compared to the constant current, and the control voltage $V_{miller}$ can be then determined. When the sense current $I_{sense}$ is small, the current mirror 42 provides a high control voltage $V_{miller}$ due to the constant current from the current source 41. On the contrary, the current mirror 42 provides a low control voltage $V_{miller}$ when the sense current $I_{sense}$ is large.

As such, for low load currents, a bias current is larger and the voltage is high, while the voltage will go down when the load current $I_{load}$ goes above a limit. In an example, a bias current may be larger in a low load current condition and may result in a high control voltage, whereas the control voltage $V_{miller}$ may go down when the load current $I_{load}$ exceeds a threshold. This can be seen from the diagrams of FIG. 3(a). Curve 32 indicates that the control voltage $V_{miller}$ goes significantly down after the load current $I_{load}$ has reached a certain value (the threshold value). Likewise, the Miller capacitance $C_{miller}$ goes significantly down after the load current $I_{load}$ has reached the threshold value, as represented by curve 33. In this embodiment, the transition between these two states, i.e. "$V_{miller}/C_{miller}$ is high" and "$V_{miller}/C_{miller}$ is low", will occur for a narrow range of load currents.

Figure 4B:
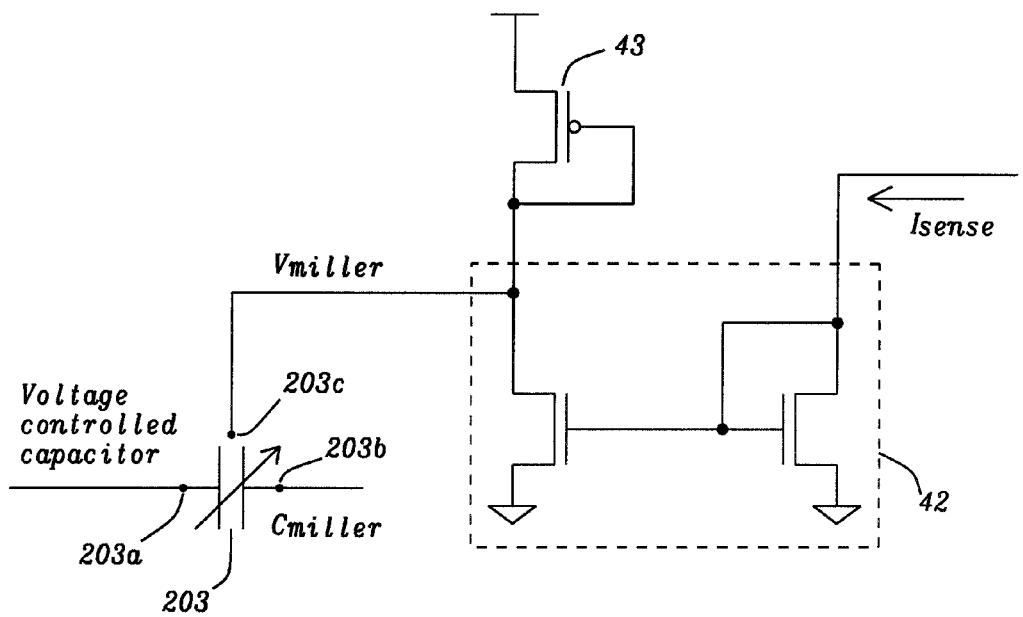

As alternative, the current-to-voltage converter 210 further comprises a diode 43, as shown in FIG. 4(b). The diode 43 is coupled to the current mirror 42 and converts the sense current $I_{sense}$ received by the current mirror 42 to the control voltage $V_{miller}$. When the sense current is small, the control voltage remains high due to low voltage drop across the diode. In contrast, the control voltage becomes low due to high voltage drop across the diode for a large sense current.

The current-to-voltage converter 210 thus provides the control voltage $V_{miller}$ which is converted from the sense current $I_{sense}$, on which the control voltage $V_{miller}$ depends: the control voltage $V_{miller}$ decreases as the sense current $I_{sense}$ or the load current $I_{load}$ increases in presence of the diode 43. In one example, the diode 43 can be optionally implemented with a diode-coupled PMOS transistor. If a PMOS diode is used to convert the current to a voltage, diagrams for $V_{miller}$ and $C_{miller}$ similar to using the implementation setup of FIG. 4(a) can be obtained, but a smoother transition between two states, i.e. "$V_{miller}/C_{miller}$ is high" and "$V_{miller}/C_{miller}$ is low", caused by the PMOS diode may appear. In other words, one can see more clearly an inverse relation between the control voltage ($V_{miller}$)/Miller capacitance ($C_{miller}$) and the load current $I_{load}$, as illustrated by dashed curves 32' and 33' in FIG. 3(a). Accordingly, curves 32' and 33' go down more smoothly towards large load currents if the adaptive Miller compensation capacitor is implemented with the setup of FIG. 4(b).

In an embodiment, the control signal generator optionally comprises a load current detector (not shown). The load current detector generates a control voltage to control the configurable Miller capacitor 203.

Figure 6:
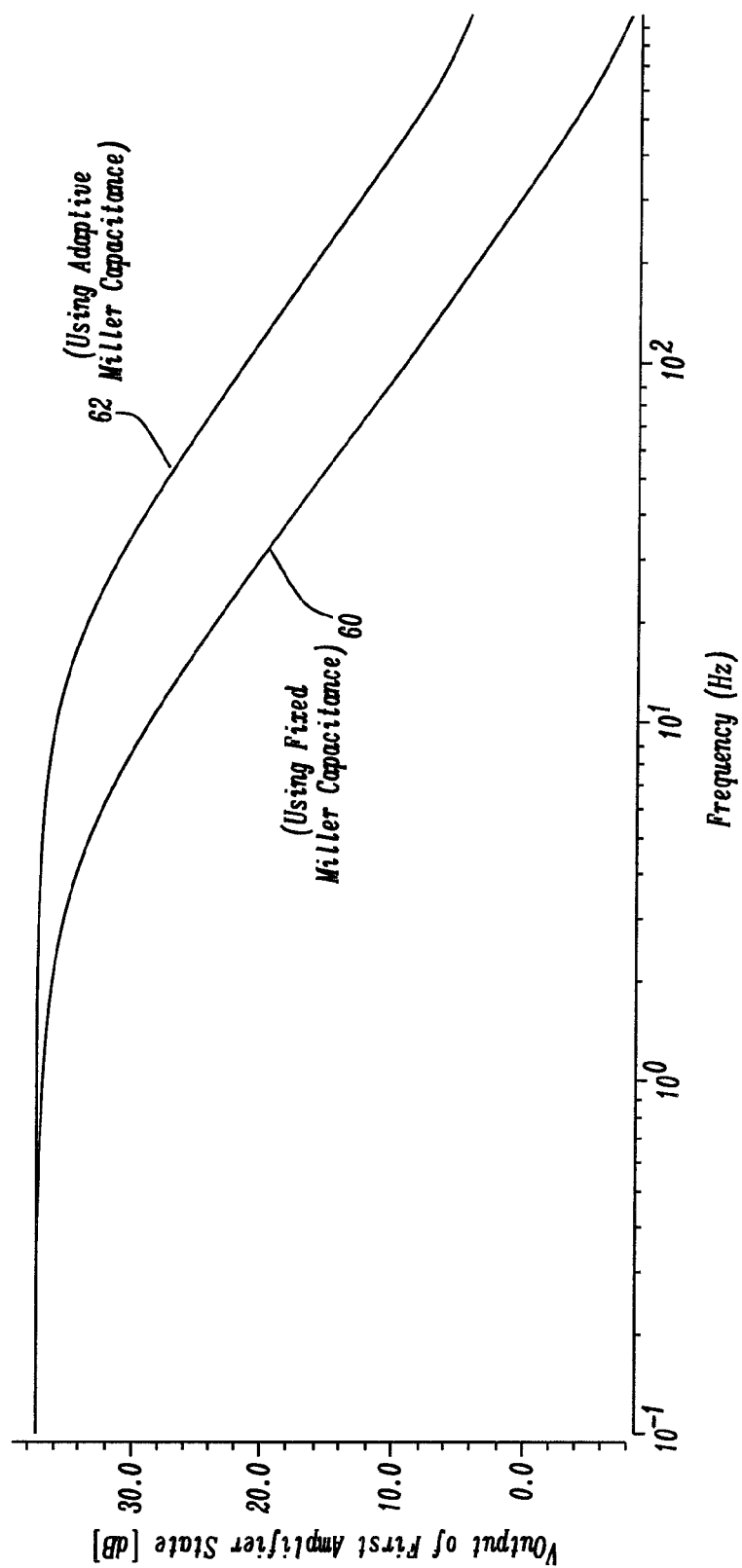
FIG. 6 shows results for the frequency dependent transfer function of output voltage of the first amplifier stage in a real multi-stage amplifier.

FIG. 6 shows results for the frequency dependent transfer function of output voltage of the first amplifier stage (i.e. the differential amplifier) $V_1$ in a real multi-stage amplifier. Results of using the proposed adaptive Miller compensation scheme and using a prior-art constant Miller capacitance are compared. Curve 60 shows the frequency response of $V_1$ using constant Miller capacitance and curve 62 represents the frequency response of node $V_1$ using the proposed adaptive Miller compensation scheme. As one can see from the diagram, the transfer function is shifted towards higher frequency by using the proposed adaptive Miller compensation scheme. Therefore, bandwidth extension of the first amplifier stage $V_1$ can be achieved with the proposed adaptive Miller compensation scheme.

Figure 7:
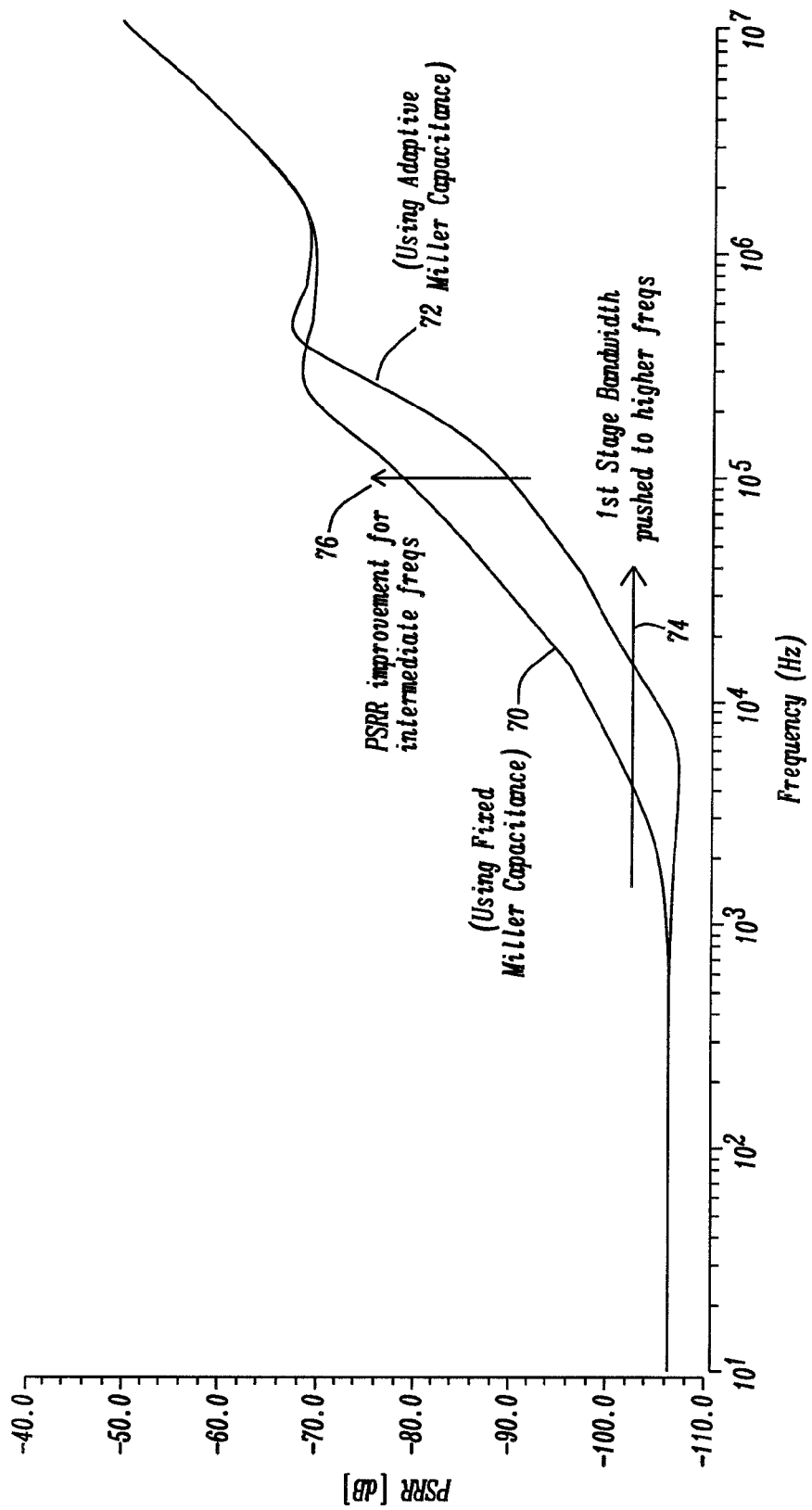
FIG. 7 shows comparison of the power supply rejection ratio (PSRR) across frequency between adaptive Miller compensation and fixed Miller capacitor.

FIG. 7 shows comparison of the power supply rejection ratio (PSRR) across frequency between using adaptive Miller compensation and using fixed Miller capacitor. The PSRR shown in FIG. 7 has been calculated in the same way as in FIG. 3(c). Changes in PSRR over a frequency range (10 Hz-10 MHz) of using the proposed adaptive Miller compensation scheme and using a prior-art constant Miller capacitance are compared. Curve 70 represents the PSRR across frequency using a fixed Miller capacitor, i.e. a constant Miller capacitance, while curve 72 represents the PSRR across frequency using the proposed adaptive Miller compensation scheme, i.e. controlling the Miller capacitance $C_{miller}$ according to the load current $I_{load}$. As the bandwidth of the first amplifier stage has been pushed to higher frequencies through the use of adaptive Miller capacitance, PSRR is shifted towards higher frequencies by using the proposed adaptive Miller compensation scheme, as indicated by arrow 74 in FIG. 7. Furthermore, one can see a significant improvement in PSRR for intermediate frequencies (more than 10 dB at 100 kHz) by using the proposed adaptive Miller compensation scheme, as indicated by arrow 76 in FIG. 7.

As such, the proposed adaptively-compensated multi-stage amplifiers provide linear regulators with variable dominant poles across frequency. It is appreciated that the extended bandwidth of the first amplifier stage at relatively high load currents can be achieved by controlling the value of the Miller capacitor across the load. It is further appreciated that the larger bandwidth at low frequency significantly improves the PSRR, thereby providing high PSRR linear regulators with low quiescent current consumption.

Furthermore, by using the proposed multi-stage amplifiers whose dynamics is adapted to the load conditions of the circuit, the dominant pole is pushed to higher frequencies and the circuit can react faster to changes in the reference voltage $V_{ref}$. In other words, the bandwidth of the first amplifier stage changes with the load condition by using the proposed technique. In general, this effect can be observed by sweeping the load current for monitoring the transfer function with poles and/or zeros of the adaptive Miller compensation which may change across load current.

Figure 5:
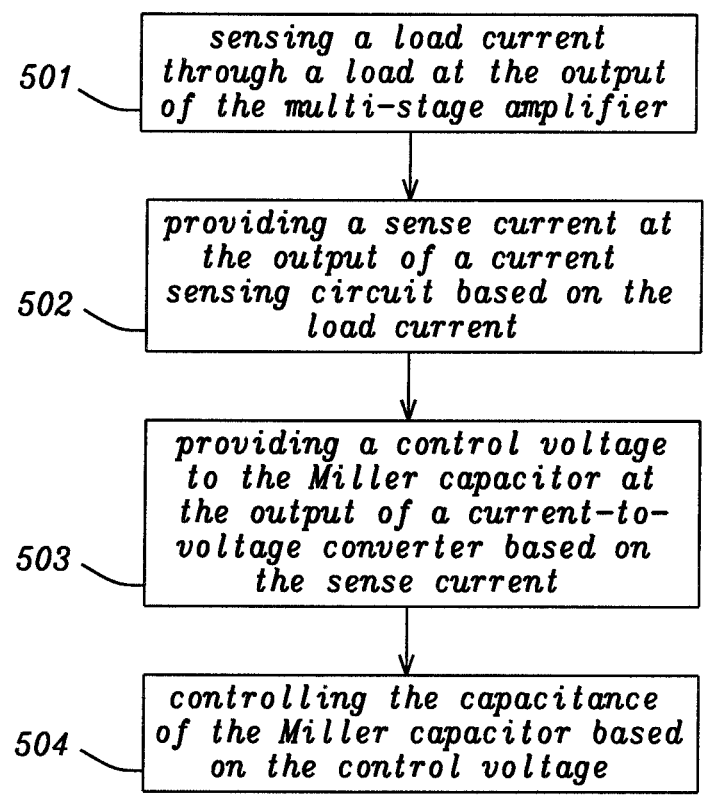
FIG. 5 shows a flow diagram of an example method for operating the multi-stage amplifier with the adaptive Miller compensation scheme.

FIG. 5 shows a flow diagram of an example method 500 for operating a multi-stage amplifier 200 with the adaptive Miller compensation scheme. The method 500 comprises the step of sensing 501 a load current $I_{load}$ through a load 205 at the output of the multi-stage amplifier 200, where the load 205 is coupled to an output of the multi-stage amplifier 200. Furthermore, the method 500 comprises providing 502 a sense current $I_{sense}$ at the output of a current sensing circuit 209, based on the load current $I_{load}$. As mentioned above, the sense current $I_{sense}$ may be proportional to the load current $I_{load}$. The method 500 further comprises providing 503 a control voltage $V_{miller}$ to the Miller capacitor 203 at the output of a control signal generator, e.g. current-to-voltage converter 210, based on the sense current $I_{sense}$, such that the control voltage $V_{miller}$ decreases as the sense current $I_{sense}$ increases. As a result, the provided control voltage decreases as the load current $I_{load}$ increases.

Furthermore, the method 500 comprises controlling 504 the capacitance of the Miller capacitor 203 $C_{miller}$ based on the control voltage $V_{miller}$. Thus, the capacitance of the Miller capacitor 203 $C_{miller}$ can be controlled according to the load current $I_{load}$. As mentioned above, the capacitance of the Miller capacitor 203 $C_{miller}$ decreases as the load current $I_{load}$ increases or, preferably, the capacitance of the Miller capacitor 203 $C_{miller}$ is controlled inversely proportional to the load current $I_{load}$ if the adaptive Miller compensation capacitor 203 is implemented with the setup of FIG. 4(b).

Therefore, the dynamics of multi-stage amplifiers is adapted to the load conditions of the circuit, thereby pushing the dominant pole, i.e. the pole of the first amplifier stage, to higher frequencies and the circuit can react faster to changes in the reference voltage $V_{ref}$. As such, the PSRR for large loads is improved at medium frequencies due to the larger bandwidth of the first amplifier stage.

As such, the compensation performance of the Miller capacitor can be adapted for various current load conditions by dynamically controlling the capacitance of the Miller capacitor in the multi-stage amplifier according to the load current. It is appreciated that the bandwidth at the output of the first amplifier stage can be maximized without losing the stability of the multi-stage amplifier. The proposed method 500 can also be used for improving the PSRR of the multi-stage amplifier.

In the disclosure, a multi-stage amplifier using the adaptive Miller compensation scheme and a corresponding method have been described, which are configured to extend the bandwidth of the first amplifier stage for large load conditions. In other words, the capacitive loading at the output of the first amplifier stage is optimized according to the load without sacrificing the amplifier stability. Consequently, the PSRR for large loads is improved at medium frequencies due to the larger bandwidth of the first amplifier stage. Furthermore, load release recovery from maximum current to no/small current in a multi-stage amplifier can be improved by applying this proposed adaptive Miller compensation scheme.

It should be noted that the description and drawings merely illustrate the principles of the proposed methods and systems. Those skilled in the art will be able to implement various arrangements that, although not explicitly described or shown herein, embody the principles of the invention and are included within its spirit and scope.

Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A linear regulator comprising:
a first amplifier stage having a differential input and an output, the output of the first amplifier stage being coupled with a first terminal of a capacitor having a controllable capacitance, wherein the differential input comprises a reference input and a feedback input, the reference input is coupled to a reference voltage $V_{ref}$ and the feedback input is coupled to a linear regulator output voltage $V_{out}$ via a feedback factor;
a second amplifier stage having an input and an output, the input of the second amplifier stage being coupled to the output of the first amplifier stage and the first terminal of the capacitor, the output of the second amplifier stage being coupled to a second terminal of the capacitor and an output of the linear regulator;
a current sensing circuit having an input and an output, the input of the current sensing circuit being coupled with the output of the linear regulator; and
a control signal generator being coupled between the output of the current sensing circuit and a control terminal of the capacitor, wherein the control signal generator provides a control signal to the capacitor, wherein the capacitance of the capacitor is controlled by the control signal.

2. The linear regulator of claim 1, wherein the current sensing circuit provides a sense current based on a load current through a load, the load being coupled to the output of the linear regulator.

3. The linear regulator of claim 2, wherein the sense current is proportional to the load current.

4. The linear regulator of claim 2, wherein the control signal generator is a current-to-voltage converter that provides a control voltage based on the sense current, the control voltage decreasing as the sense current increases.

5. The linear regulator of claim 1, wherein the capacitance of the capacitor and the load current have an inverse relation, in particular the capacitance of the capacitor decreasing as the load current increases.

6. The linear regulator of claim 1, wherein the control signal generator comprises a current mirror being coupled between the output of the current sensing circuit and the control terminal of the capacitor, the current mirror receiving the sense current from the output of the current sensing circuit.

7. The linear regulator of claim 6, wherein the control signal generator further comprises a current source being coupled to the current mirror, the control signal generator providing a control voltage based on the sense current and a constant current from the current source.

8. The linear regulator of claim 6, wherein the control signal generator further comprises a diode being coupled to the current mirror to convert the sense current to a control voltage.

9. The linear regulator of claim 6, wherein the current mirror comprises an NMOS current mirror.

10. The linear regulator of claim 8, wherein the diode comprises a diode-coupled PMOS transistor.

11. The linear regulator of claim 1, wherein the capacitor acts as Miller capacitor to split poles for increasing stability.

12. The linear regulator of claim 1, wherein the capacitor comprises a varactor or a voltage controlled capacitor.

13. A method of operating a linear regulator comprising a first amplifier stage; a second amplifier stage; and a Miller capacitor, an output of the first amplifier stage being coupled to an input of the second amplifier stage, the Miller capacitor being coupled between the input of the second amplifier stage and an output of the second amplifier stage, wherein the first amplifier stage comprises a reference input and a feedback input, the reference input is coupled to a reference voltage $V_{ref}$ and the feedback input is coupled to a linear regulator output voltage $V_{out}$ via a feedback factor,
the method comprising:
sensing a load current through a load, the load being coupled to an output of the linear regulator;
providing a sense current based on the load current;
providing, based on the sense current, a control voltage to the Miller capacitor; and
controlling, based on the control voltage, the capacitance of the Miller capacitor.

14. The method of claim 13, wherein the sense current is proportional to the load current, wherein the control voltage decreases as the sense current increases, wherein the capacitance of the Miller capacitor decreases as the load current increases.

15. The method of claim 13, wherein the capacitance of the Miller capacitor is controlled inversely proportional to the load current.

16. The method of claim 13, wherein the control voltage is provided by converting the sense current to the control voltage, in particular by comparing the sense current to a constant current.

17. A method of operating a linear regulator comprising the steps of:
providing a first amplifier stage having a differential input and an output, the output of the first amplifier stage being coupled with a first terminal of a capacitor having a controllable capacitance, wherein the differential input comprises a reference input and a feedback input, the reference input is coupled to a reference voltage $V_{vref}$ and the feedback input is coupled to a linear regulator output voltage $V_{out}$ via a feedback factor;
providing a second amplifier stage having an input and an output, the input of the second amplifier stage being coupled to the output of the first amplifier stage and the first terminal of the capacitor, the output of the second amplifier stage being coupled to a second terminal of the capacitor and an output of the linear regulator;
providing a current sensing circuit having an input and an output, the input of the current sensing circuit being coupled with the output of the linear regulator; and
providing a control signal generator being coupled between the output of the current sensing circuit and a control terminal of the capacitor, wherein the control signal generator provides a control signal to the capacitor, wherein the capacitance of the capacitor is controlled by the control signal.

18. The method of claim 17, wherein the current sensing circuit provides a sense current based on a load current through a load, the load being coupled to the output of the linear regulator.

19. The method of claim 18, wherein the sense current is proportional to the load current.

20. The method of multi-stage amplifier of claim 18, wherein the control signal generator is a current-to-voltage converter that provides a control voltage based on the sense current, the control voltage decreasing as the sense current increases.

21. The method of claim 17, wherein the capacitance of the capacitor and the load current have an inverse relation, in particular the capacitance of the capacitor decreasing as the load current increases.

22. The method of claim 17, wherein the control signal generator comprises a current mirror being coupled between the output of the current sensing circuit and the control terminal of the capacitor, the current mirror receiving the sense current from the output of the current sensing circuit.

23. The method of claim 22, wherein the control signal generator further comprises a current source being coupled to the current mirror, the control signal generator providing a control voltage based on the sense current and a constant current from the current source.

24. The method of claim 22, wherein the control signal generator further comprises a diode being coupled to the current mirror to convert the sense current to a control voltage.

25. The method of claim 22, wherein the current mirror comprises an NMOS current mirror.

26. The method of claim 24, wherein the diode comprises a diode-coupled PMOS transistor.

27. The method of claim 17, wherein the capacitor acts as Miller capacitor to split poles for increasing stability.

28. The method of claim 17, wherein the capacitor comprises a varactor or a voltage controlled capacitor.

* * * * *